United States Patent [19]

Main

[11] 4,283,683
[45] Aug. 11, 1981

[54] AUDIO BRIDGE CIRCUIT
[75] Inventor: William E. Main, Mesa, Ariz.
[73] Assignee: Motorola Inc., Schaumburg, Ill.
[21] Appl. No.: 42,734
[22] Filed: May 29, 1979
[51] Int. Cl.³ .............................................. H03F 3/26
[52] U.S. Cl. .................................. 330/262; 330/146; 330/270; 330/275
[58] Field of Search ............... 330/146, 259, 262, 270, 330/275, 290

[56] References Cited

U.S. PATENT DOCUMENTS 3,983,502  9/1976  Wheatley, Jr. ...................... 330/146

Primary Examiner—James B. Mullins
Attorney, Agent, or Firm—Michael D. Bingham

[57] ABSTRACT

A circuit responsive to applied audio signals for amplifying the same and providing the amplified signals across differential output terminals. The circuit comprising an audio amplifying section which is responsive to the audio input signals for amplifying the same and a feedback circuit connected across the output terminals for providing a feedback signal to the amplifier section to reduce any direct current offset voltage errors appearing across the output terminals to a minimum value. Additionally, the amplifier section includes circuitry for setting the quiescent voltage bias levels of the output terminals to a predetermined level and for providing common-mode rejection of voltage supply line ripple.

18 Claims, 2 Drawing Figures

AUDIO BRIDGE CIRCUIT

FIELD OF THE INVENTION

This inventon relates to power amplifiers and more particularly to audio bridge power amplifier circuits for use in automotive anAd home entertainment systems.

BACKGROUND OF THE PRIOR ART

Audio bridge circuits which are well known in the art comprise many different circuit configurations. In general, prior art audio bridge circuits consist of a pair of operational amplfiers having respective inputs so connected to receive an input signal which is then amplified and appears across a pair of floating differential output terminals. A load, such as a speaker is connected to the output terminals. The signal developed across the load is swung in both a positive and a negative direction in order that maximum output power is achieved. An example of a prior art audio bridge circuit is illustrated in volume 1 of the magazine "Electronic Design" published Jan. 4, 1978 at page 125.

Some contemporary monolithic integrated audio bridge circuits suffer from several disadvantages. For example, most bridge circuits require many external components, such as capacitors. Thus, not only are extra external pinouts required, but the number of external components is also increased, which in turn increases the cost of the circuits.

Another disadvantage of some contemporary audio bridge circuits is that, due to the high gain of the circuit, large offset voltages may appear across the output terminals. If a speaker is connected to the output terminal, as would be a typical application, the offset voltage will produce a large current through the speaker which causes unsymmetrical clipping of the input signal as well as large power consumption. Thus, it is important to reduce this offset voltage to overcome the aforementioned disadvantages.

Still further, some contemporary prior art audio bridge circuits produce a noise "thump" at both turn on and turn off of the circuit.

Hence, a need exists for a monolithic audio bridge circuit that requires a minimum of external components wherein the offset voltage appearing across the output terminals thereof is severely reduced or eliminated.

SUMMARY OF THE INVENTION

Accordingly, an object of the present invention is to provide an improved monolithic integrated audio bridge circuit.

Another object of the present invention is to provide a monolithic audio bridge circuit requiring a minimum of external components and having a mininum offset voltage across the output terminals thereof.

Still another object of the present invention is to provide an audio bridge circuit wherein the output terminals are buffered from any noise producing spikes which otherwise may be produced at either turn on or turn off of the circuit.

The above and other objects are met in accordance with the present invention wherein an audio bridge circuit, suitable for fabrication in monolithic integrated circuit form, is disclosed comprising amplifier circuitry having an input and a pair of output terminals whereby an input signal applied to the input thereof is amplified and appears across the output terminals and feedback circuity coupled across the output terminals of the amplifier circuitry having an output coupled back to the amplifier circuitry which is responsive to any offset voltage appearing across the output terminals of the amplifier circuitry to provide a feedback signal to reduce the quiescent offset voltage to a minimum level.

DETAILED DESCRIPTION OF THE PREFERRED EMBODIMENT

Figure 1:
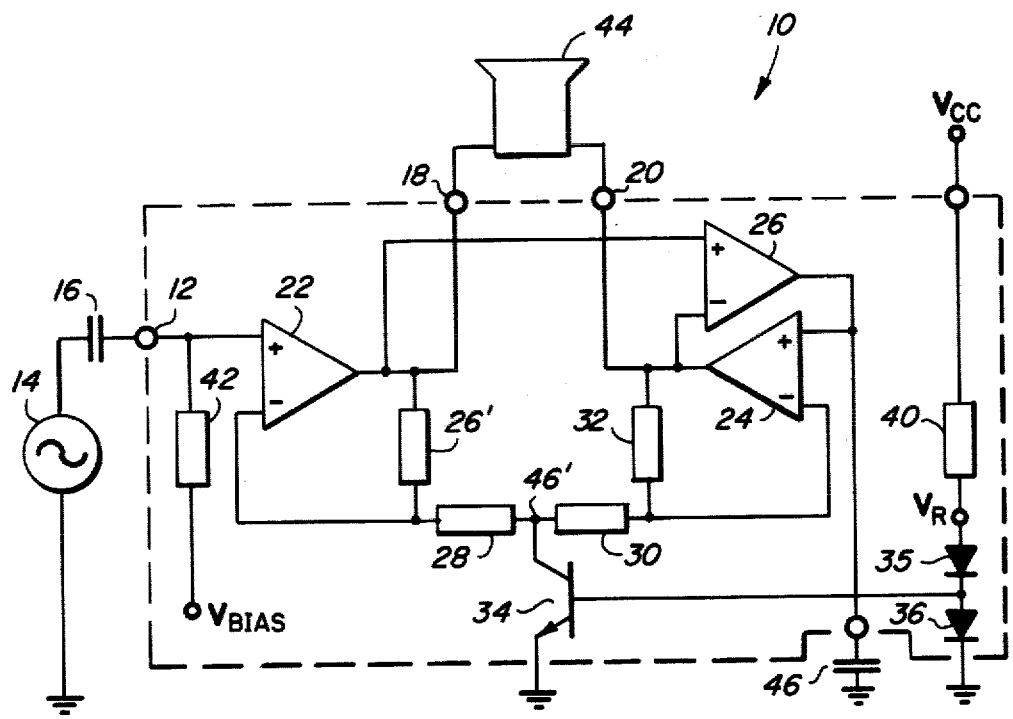
FIG. 1 is a partial schematic and block diagram of an audio bridge circuit of the present invention which is useful for explaining the general concepts of the preferred embodiment of the invention.

Turning to FIG. 1 there is illustrated audio bridge circuit 10 which is useful for explaining the general circuit operaton of the preferred embodiment of the present invention. It is to be understood that the circuit included within the dashed lines is suitable to be manufactured in integrated circuit form.

Terminal 12 is the input to the audio bridge circuit and receives an audio signal, which is to be amplified, from audio source 14 via coupling capacitor 16. The output of audio bridge 10 is provided at output terminals 18 and 20. Audio bridge 10 comprises operational amplifiers 22, 24 and 26. The amplified output signal appears across resistors 26', 28, 30 and 32 which are connected in series to each other between output terminals 18 and 20. A current mirror arrangement consisting of transistor 34, diodes 35 and 36 as well as resistor 40 operates to set the direct current (dc) output voltage level at output terminals 18 and 20 as a function of supply voltage $V_{CC}$ as will be explained hereinafter. Resistor 42 is shown as being connected between the non-inverting input terminal of operational amplifier 22 and a bias voltage, $V_{Bias}$, whereby the input dc level may be adjusted accordingly. A speaker 44 is connected between output terminals 18 and 20 and is the load for the audio bridge circuit.

Conceptually, operational amplifier 26 which has non-inverting and inverting input terminals connected to the outputs of operational amplifier 22 and 24 respectively operates as an comparator to compare the dc offset voltage appearing across terminals 18 and 20 and to provide a feedback signal at its output which is filtered by capacitor 46. The filtered feedback signal is applied to the non-inverting output of operational amplifier 24. Hence, the dc output offset voltage appearing across the output terminals is reduced to a minimum; being no greater than the offset voltage of operational amplifier 26. By reducing the output voltage appearing across terminals 18 and 20 the quiescent current flow through speaker 44 is reduced which in turn reduces the direct current power drain of the system.

As will be explained, the aforementioned current mirror arrangement functions to set the dc voltage bias levels at output terminals 18 and 20 to a predetermined level which is a function of the supply voltage $V_{CC}$. Moreover, common mode rejection of supply voltage ripple is provided. In operation, it can be shown that the current through diode 36 is equal to:

$$\frac{V_{CC} - V_R}{R_{40}} \tag{1}$$

Transistor 34 and diode 36 form a well known current mirror structure whereby the current passing through node 46' and transistor 34 is substantially equal to the current through diode 36. Hence, it can be shown that the dc voltage, $V_O$, which appears across both output termimals 18 and 20 is equal to:

$$V_O = V_{bias} + R_{26} \frac{V_{CC} - V_R}{2R_{40}} \quad (2)$$

Thus, if $V_{bias}$ equals $V_R/2$; resistor 26 equals resistor 40; and resistor 28 equals resistor 30, $V_O$ equals:

$$V_O = \frac{V_{CC}}{2} \quad (3)$$

Therefore, both output terminals are substantially at the same voltage level as previously mentioned.

Figure 2:
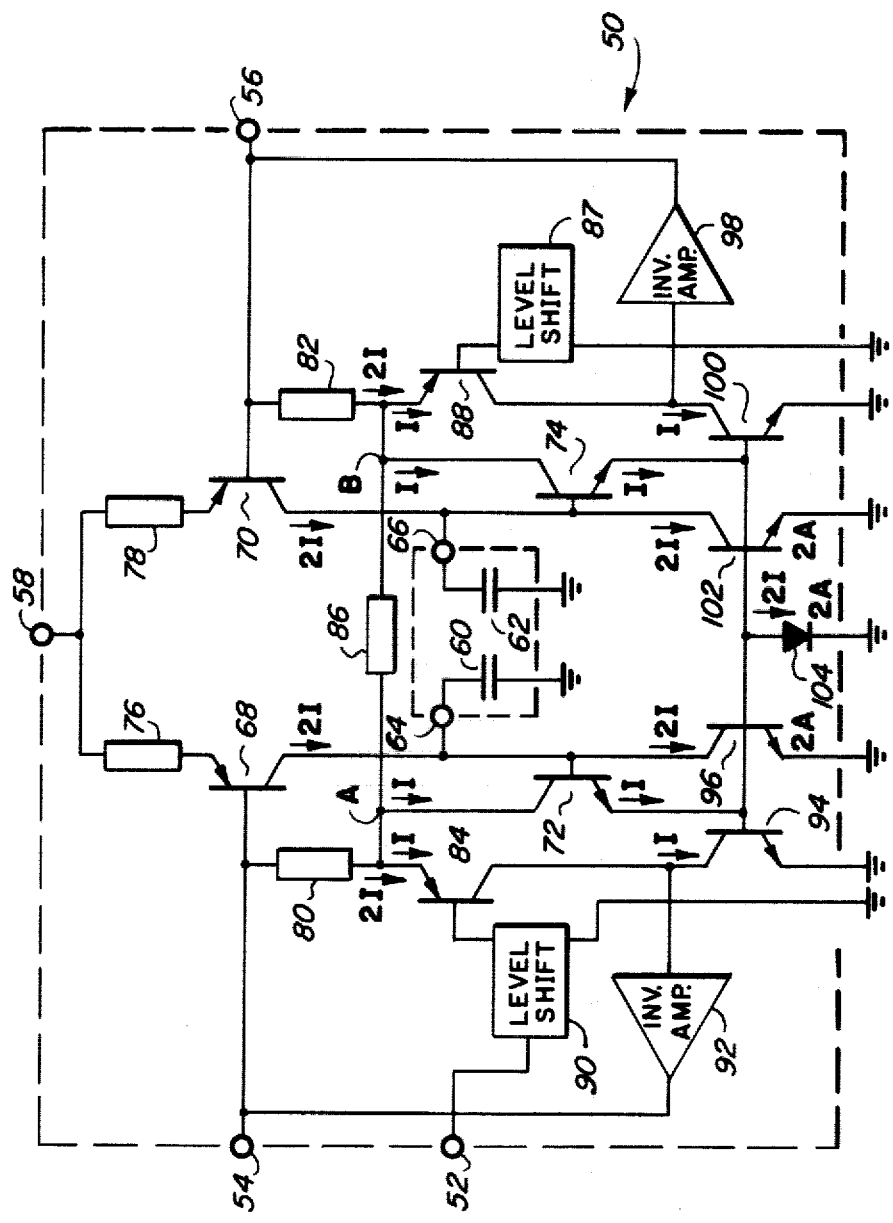
FIG. 2 is a schematic diagram of the preferred embodiment of the present invention.

Turning now to FIG. 2, there is illustrated audio bridge circuit 50 of the preferred embodiment which implements the aforedescribed features of the invention. Audio bridge circuit 50 is suitable for fabrication in monolithic circuit form. The intput signal is applied (via a coupling capacitor) to input terminal 52 and the output signal is developed across output terminals 54 and 56. Terminal 58 is adapted to be connected to a source of operating potential $V_{CC}$. Filter capacitors 60 and 62 are connected between respective terminals 64 and 66 to a common terminal at which a ground reference potential is supplied.

Consistent with the circuitry shown in FIG. 1, transistors 68, 70, 72, 74 comprise comparator 26 for providing feedback signals for reducing any offset voltage which appears across output terminals 54 and 56. As illustrated, the emitter electrodes of transistors 68 and 70 are coupled via respective resistors 76 and 78 to terminal 58. The base electrode of transistor 68 is connected to output terminal 54 and to one terminal of resistor 80, the collector electrode is connected to the base of transistor 72. The base electrode of transistor 70 is connected to output terminal 56 and to one terminal of resistor 82 with the collector electrode being connected to the base electrode of transistor 74. The other terminal of resistor 80 is connected at junction point A to the emitter electrode of transistor 84, to the collector electrode of transistor 72 and to one side of resistor 86. The other terminal of resistor 86 is connected at junction point B to the collector electrode of transistor 74, the emitter electrode of transistor 88 and the second terminal of resistor 82. The collector electrodes of transistors 68 and 70 form first and second outputs and the collector electrodes of transistors 72 and 74 form third and fourth outputs of the feedback circuity with the emitters of the latter two transistors being connected to the base electrodes of transistors 94 and 100 respectively.

Input terminal 52 is connected to the base electrode of transistor 84 through voltage level shift circuit 90 which may comprise a pair of cascaded transistors as is known. The collector electrode of transistor 84 is connected both to the input of inverting amplifier 92 and to the collector electrode of transistor 94. The output of inverting amplifier 92 is connected to output terminal 54 of audio bridge circuit 50. The emitter electrode of transistor 72 is connected to the base electrodes of transistors 94 and 96 to supply base drive current thereto. The emitter electrodes of transistors 94 and 96 are returned to ground reference with the collector electrode of transistor 96 being connected to the collector electrode of transistor 68.

Mirroring the aforedescribed circuitry, the base electrode of transistor 88 is returned to ground reference via voltage level shift circuit 87 with the collector electrode of transistor 88 being connected both to the input of inverting amplifier 98 and the collector electrode of transistor 100. The output of inverting amplifier 98 is aconnected to output terminal 56. The emitter electrode of transistor 74 is connected to the base electrodes of transistors 100 and 102 to provide base drive current thereto. The emitter electrodes of transistors 100 and 102 are returned to ground reference. The anode of diode 104 is connected to the emitters of transistors 72 and 74 and the cathode thereof returned to the ground reference.

It is to be noted that the emitter areas of transistor 96 and 102, as well as the PN junction area of diode 104, are of equal dimensions and are twice the area size of the emitter areas of the other transistors comprising audio bridge circuit 50. Moreover, in the preferred embodiment, resistors 76, 78, 80 and 82 are of equal magnitude. Finally, the magnitude of resistors 80 and 82 are substantially greater than the magnitude of resistors 86 as will be more particularly referred to later.

QUIESCENT OPERATING CONDITIONS

As previously mentioned, audio bridge circuit 50 has a balance configuration such that if an imaginary vertical line is drawn through terminal 58, audio bridge circuit 50 is divided into left and right branch circuits which are a mirror of each other. Additionally, each transistor in one branch circuit is ideally matched to its counterpart in the other branch, e.g., transistor 68 is matched with transistor 70.

In the preferred embodiment, output terminals 54 and 56 are biased at a voltage level equal to ½ VCC as will now be explained. It is assumed that in a quiescent operating condition that all transistors are in the conducting state with collector-to-emitter currents of the magnitudes shown in FIG. 2. Hence, transistors 68 and 70 generate equal source currents each of a magnitude 2I which are the collector currents of transistors 96 and 102 respectively. Thus, the currents through resistors 76 and 78 are set by the former transistors and vice versa. Transistors 72 and 74 are rendered conductive by transistors 68 and 70 being in a conductive state and in turn render transistors 94, 96 and transistors 100, 102 conductive respectively. Substantially all of the emitter current of transistors 72 and 74 are combined and conducted through diode 104. Diode 104 being connected to the base electrodes of transistors 96 and 102 establishes the currents through these two transistor of the magnitude equal to the collector currents of transistors 68 and 70. Hence, transistors 96 and 102 sink the collector currents from respective transistor 68 and 70. Moreover, transistor 84 and 88 are biased to have collector currents equal to half the collector currents of transistor 68 and 70. Ideally, transistors 94 and 100 sink the respective collector currents of transistors 84 and 88 in the quiesecent operating condition. From the foregoing, it is recognized that the currents through resistors 80 and 82 are then equal to the currents through resistor 76 and 78. Therefore, by making the resistors equal in magnitude, it can be shown that output terminals 54 and 56 are biased up at one-half the power supply voltage level. Thus, the combination of the feedback circuit with the transistors 94, 96, 100, 102 and diode 104 sets the voltage levels at terminals 54 and 56 to equal magnitudes. This severely reduces any background noise by preventing current flow between the output terminals via the load which is connected therebetween.

The differential action of transistors 72 and 74 reduces to a minimum or even eliminates any offset voltage between output terminals 54 and 56. For example, if the voltage appearing at terminal 54 is more positive than the voltage appearing at terminal 56, the current flowing from transistor 68 will then be less than the current flowing from transistor 70. This causes transistor 74 to become more conductive than transistor 72. However, the currents through transistors 96 and 102 must remain constant and substantially equal to one another because of the current mirroring action provided by diode 104. Moreover, the currents through transistors 94 and 100 also remain constant. Therefore, as transistor 72 becomes less conductive, transistor 84 becomes more conductive which raises the voltage level appearing at the input of inverting amplifier 92. This causes the voltage level at output terminal 54 to decrease. Concurrently, the increased current through transistor 74 renders transistor 88 less conductive which causes the voltage level at the input of inverting amplifier 98 to decrease which in turn raises the voltage level at output terminal 56. This action continues until the voltage levels appearing at the two output terminals are substantially equal thereby eliminating the voltage offset therebetween. Moreover, any power supply ripple is filtered through capacitors 60 and 62 whereby the output voltages appearing at terminals 54 and 56 remain constant with respect to each other.

At initial turn on, output terminals 54 and 56 are biased to their quiescent levels at predetermined and equal rates as will be explained. This is to prevent any noise spike which might otherwise be generated if the output terminals were charged to their quiescent operating voltage levels at different rates. At turn on, transistors 68 and 70 are rendered conductive and capacitors 60 and 62 are charged until such time that transistors 72 and 74 are rendered conductive. Transistor 72 and 74, being matched, are then rendered conductive at the same rate and in turn cause transistors 94, 96 and 100, 102 to be rendered conductive at this same rate. As transistors 94 and 100 are rendered conductive the voltage level at respective inverting inputs of operational amplifiers 92 and 98 is decreased thereby increasing the voltage levels at the outputs thereof. Hence the voltage levels at terminals 54 and 56 decrease in magnitude at the rate transistors 72, 74, 94 and 100 are rendered conductive until the quiescent voltage level is obtained. The aforedescribed action continues until such time as the operating condition is established and the currents through transistors 84 and 88 become equal to the currents through transistors 94 and 100 respectively.

ALTERNATING CURRENT OPERATING CONDITION

The gain of the audio bridge circuit is determined by resistor 86 and can be shown to be a value substantially equal to the ratio of the sum of the resistor values of resistors 80 and 82 to the resistor value of resistor 86. Because the emitter electrode of transistor 88 is at virtual ground, the input voltage is developed across resistor 86 whereas the output voltage is developed across resistors 80, 86 and 82 to appear across output terminals 54 and 56. Any audio frequency output offset voltage is filtered by filter capacitors 60 and 62 and is reduced at terminals 54 and 56. Thus, only direct current voltage information is fed back to eliminate direct voltage offsets. Moreover, any supply line ripple is also filtered by the capacitors and does not appear across the output terminals.

What has been described is an audio bridge circuit requiring few external components. Offset terminals which may otherwise appear across the output terminals of the audio bridge circuit are severely, if not totally, reduced by the utilization of a differential feedback circuit. Additionally, both turn on and turn off noise "thumps" are eliminated by controlling the rate at which the quiescent output bias levels are increased and decreased respectively. Finally, the output terminals of the audio bridge circuit are set to quiescent operating levels by a level setting circuitry operating in conjunction with the feedback circuit.

I claim:

1. Audio bridge circuit having an input terminal, first and second output terminals, comprising:
   amplifier means coupled between the input and first and second output terminals of the audio bridge circuit for amplifying input signals applied to the input terminal and providing the amplified signals across the first and second output terminals, said amplifier means including current mirror circuit means for setting both the first and second output terminals at a predetermined quiescent dc bias potential level the magnitude of which is substantially equal to one-half the magnitude of a first operating potential supplied to the audio bridge circuit;
   feedback circuit means having first and second inputs connected to the first and second output terminals of the audio bridge circuit respectively, said feedback circuit means being responsive to a direct current offset voltage appearing at said first and second inputs thereof for providing a feedback signal to said amplifier means to cause said direct current offset voltage to be severely reduced.

2. The audio bridge circuit of claim 1 wherein said amplifier means further includes:
   first electron control means having first, second and control electrodes, said control electrode being coupled to the input terminal of the audio bridge circuit, said first electrode being coupled to the first output terminal of the audio bridge circuit, said second electrode being coupled with said current mirror circuit means;
   second electron control means having first, second and control electrodes, said control electrode being connected to a ground terminal at which is provided a ground reference potential; said first electrode being coupled to the second output terminal of the audio bridge circuit, said second electrode being coupled to said current mirror circuit means; and
   resistive circuit means coupled between the first and second output terminals of the audio bridge circuit and to said first electrodes of said first and second electron control means.

3. The audio bridge circuit of claim 2 wherein said feedback circuit means includes:
   first differential comparator means having first and second inputs and first and second outputs, said first and second inputs being coupled with the first and second output terminals of the audio bridge circuit respectively; and second differential comparator means having first and second inputs and first and second outputs, said first and second inputs being coupled respectively to said first and second outputs of said first differential comparator means, said first and second outputs being coupled respectively to said first electrodes of said first and second electrode control means.

4. The audio bridge circuit of claim 3 wherein said feedback means further includes first and second charge storage means coupled to said first and second outputs of said first differential comparator means respectively.

5. The audio bridge circuit of claim 4 wherein:

said first differential comparator means includes,
   (a) first electron control means having first, second, and control electrodes, said control electrode being connected to said first input of said first differential comparator means, said second electode being connected to said first output of said comparator means;
   (b) second electron control means having first, second and control electrodes, said control electrode being connected to said second input of said first differential comparator means, said second electrode being connected to said second output of said first comparator means;
   (c) first resistive means connected between said first electrode of said first electron control means of said first differential comparator means and a terminal at which is supplied a source of operating potential; and
   (d) second resistive means connected between said first electrode of said second electron control mean of said first differential comparator means and said terminal at which is supplied said operating potential.

6. The audio bridge of claim 5 wherein:

said second differential comparator means includes,
   (a) first electron control means having first, second and control electrodes, said control electrode being connected to said first output of said first comparator means, said first electrode being coupled to said current mirror circuit means, and said second electrode being coupled to said first output of said second differential comparator means; and
   (b) second electron control means having first, second, and control electrodes, said first electrode being coupled to said current mirror circuit means, said second electrode being connected to said second output of said second differential comparator means, said control electrode being connected to said second output of said first differential comparator means.

7. The audio bridge circuit of claim 6 wherein said current mirror circuit means includes:

first electron control means having first, second and control electrodes, said first electrode being connected to said ground terminal, said second electrode being connected to said first output of said first differential comparator means, said control electrode being connected to said first electrode of said first electron control means of said second differential comparator means;

second electron control means having first, second, and control electrodes, said first electrode being connected to said ground terminal, said second electrode being connected to said second output of said first differential comparator means, said control electrode being connected to said first electrode of said second electron control means of said second differential comparator means;

third electron control means having first and second electrodes, said first electrode being connected to said ground terminal, said second electrode being connected to said control electrodes of said first and second electron control means of said current mirror circuit means;

fourth electron control means having first, second, and control electrodes, said first electrode being connected to said ground terminal, said second electrode being connected to said second electrode of said first electron control means of said amplifier means, said control electrode being connected to said control electrode of said first election control means of said current mirror circuit means;

fifth electron control means, having first, second, control electrode, said first electrode being connected to said ground terminal, said second electrode being connected to said second electrode of said second electron control means of said amplifier means, said control electrode being connected to said control electrode of said second electron control means of said current mirror circuit means;

first inverting amplifier having an input terminal and an output terminal, said input terminal being coupled to said second electrode of said fourth electron control means, said output terminal being connected to the first output terminal of the audio bridge circuit; and second inverting amplifier having an input terminal and an output terminal, said input terminal being connected to said second electrode of said fifth electron control means, said output terminal being connected to second output terminal of the audio bridge circuit.

8. The audio bridge circuit of claim 7 wherein said amplifier means includes:

first resistive means connected between the first output of the audio bridge circuit and said first electrode of said first electron control means of said amplifier means;

second resistive means connected between the second output of the audio bridge circuit and said first electrode of said second electron control means of said amplifier means; and third resistive means coupled between said first electrode of said first electron control means of said amplifier means and said first electrode of said second electron control means of said amplifier means.

9. The audio bridge circuit of claim 2 wherein said feedback circuit means includes:

first electron control means having first, second and control electrodes, said control electrode being connected to the first output terminal of the audio bridge circuit, said second electrode being connected to a first ouput terminal of said feedback circuit means;

first resistive means coupled between said first electrode of said electron control means and a terminal at which is supplied a source of operating potential;

second electron control means having first, second, and control electrodes, said control electrode being connected to the second output terminal of the audio bridge circuit, said second electrode being coupled to a second output terminal of said feedback circuit means;

second resistive means coupled between said first electrode of said second electron control means and said first electrode of said first electron control means;

third electron control means having first, second and control electrodes, said control electrode being connected to said first output terminal of said feedback circuit means, said first electrode being connected to a third output terminal of said feedback circuit means, said second electrode being connected to said first electrode of said first electron control means of said amplifier means;

fourth electron control means having first, second, and control electrodes, said first electrode being connected to a fourth output terminal of said feedback circuit means, said control electrode being connected to said second output terminal of said feedback circuit means, said second electrode being connected to said first electrode of said second electron control means of said amplifier means;

said first, second, third and fourth output terminals being connected with said current mirror circuit means.

10. The audio bridge circuit of claim 9 wherein said feedback circuit means includes:

first capacitive means having first and second terminals, said first terminal being connected to said first output terminal of said feedback circuit means, said second terminal being connected to a ground terminal at which is supplied a ground reference potential; and second capacitive means having first and second terminals, said first terminal being connected to said second output terminal of said feedback circuit means, said second terminal being connected to said ground terminal.

11. The audio bridge circuit of claim 10 wherein said current mirror circuit means includes:

first electron control means having first, second and control electrodes, said first electrode being connected to said ground terminal, said second electrode being connected to said first output terminal of said feedback circuit means, said control electrode being connected to said third output terminal of said feedback circuit means;

second electron control means having first, second, and control electrodes, said first electrode being connected to said ground terminal, said second electrode being connected to said second output terminal of said feedback circuit means, said control electrode being connected to both said fourth output terminal of said feedback circuit means and to said control electrode of said first electron control means of said current mirror circuit means; and third electron control means having first and second electrodes, said first electrode being connected to said ground terminal, said second electrode being connected to said third and fourth outputs of said feedback circuit means.

12. The audio bridge circuit of claim 11 wherein said current mirror circuit means includes:

fourth electron control means having first, second and control electrodes, said control electrode being connected to said third output terminal of said feedback circuit means, said first electrode being connected to said ground terminal, said second electrode being connected to said second electrode of said first electron control means of said amplifier means;

fifth electron control means having first, second and control electrodes, said control electrode being connected to said fourth output of said feedback circuit means, said first electrode being connected to said ground terminal, said second electrode being connected to said second electrode of said second electron control means of said amplifier means;

first comparator means coupled between said second electrode of said fourth electron control means and the first output terminal of the audio bridge circuit; and second comparator means coupled between said second electrode of said fifth electron means and the second output terminal of the audio bridge circuit.

13. Audio bridge circuit having an input terminal, first and second output terminals, comprising:

amplifier means coupled between the input and first and second output terminals for amplifying input signals supplied thereto including current mirror circuit means for setting both the first and second output terminals at a predetermined quiescent dc bias potential level; first electron control means having first, second and control electrodes, said control electrode being coupled to the input terminal of the audio bridge circuit, said first electrode being coupled to the first output terminal of the audio bridge circuit, said second electrode being coupled with said current mirror circuit means; second electron control means having first, second and control electrodes, said control electrode being connected to a terminal at which is provided a ground reference potential, said first electrode being coupled to the second output terminal of the audio bridge circuit, said second electrode being coupled to said current mirror circuit means for setting the quiescent voltage bias levels; resistive circuit means coupled between the first and second output terminals of the audio bridge circuit to said first electrodes of said first and second electron control means; feedback circuit means having first and second inputs connected to the first and second output terminals of the audio bridge circuit respectively, said feedback circuit means being responsive to a direct current offset voltage appearing at said first and second inputs thereof to provide a feedback signal to severely reduce said offset voltage and including first differential comparator means having first and second inputs and first and second outputs, said first and second inputs being coupled with the first and second output terminals of the audio bridge circuit respectively, second differential comparator means having first and second inputs and first and second outputs, said first and second inputs being coupled respectively to said first and second outputs of said first differential comparator means, said first and second outputs being coupled respectively to said second electrodes of said first and second electron control means.

14. The audio bridge circuit of claim 13 wherein said feedback means further includes first and second charge storage means coupled to said first and second outputs of said first differential comparator means respectively.

15. The audio bridge circuit of claim 14 wherein:

said first differential comparator means includes,
  (a) first electron control means having first, second, and control electrodes, said control electrode being connected to said first input of said first differential comparator means, said second electrode being connected to said first output of said comparator means;
  (b) second electron control means having first, second and control electrodes, said control electrode being connected to said second input of said first differential comparator means, said second electrode being connected to said second output of said first comparator means;
  (c) first resistive means connected between said first electrode of said first electron control means of said first differential comparator means and a terminal at which is supplied a source of operating potential; and
  (d) second resistive means connected between said first electrode of said second electron control means of said first differential comparator means and said terminal at which is supplied said operating potential.

16. The audio bridge of claim 15 wherein:
said second differential comparator means includes,
  (a) first electron control means having first, second and control electrodes, said control electrode being connected to said first output of said first comparator means, said first electrode being coupled to said current mirror circuit means, and said second electrode being coupled to said first output of said second differential comparator means; and
  (b) second electron control means having first, second, and control electrodes, said first electrode being coupled to said current mirror circuit means, said second electrode being connected to said second output of said second differential comparator means, said control electrode being connected to said second output of said first differential comparator means.

17. The audio bridge circuit of claim 16 wherein said current mirror circuit means includes:
  first electron control means having first, second and control electrodes, said first electrode being connected to said ground terminal, said second electrode being connected to said first output of said first differential comparator means, said control electrode being connected to said first electrode of said first electron control means of said second differential comparator means;
  second electron control means having first, second, and control electrodes, said first electrode being connected to said ground terminal, said second electrode being connected to said second output of said first differential comparator means, said control electrode being connected to said first electrode of said second electron control means of said second differential comparator means;
  third electron control means having first and second electrodes, said first electrode being connected to said ground terminal, said second electrode being connected to said control electrodes of said first and second electron control means of said current mirror circuit means;
  fourth electron control means having first, second, and control electrodes, said first electrode being connected to said ground terminal, said second electrode being connected to said second electrode of said first electron control means of said amplifier means, said control electrode being connected to said control electrode of said first election control means of said current mirror circuit means;
  fifth electron control means, having first, second, control electrode, said first electrode being connected to said ground terminal, said second electrode being connected to said second electrode of said second electron control means of said amplifier means, said control electrode being connected to said control electrode of said second electron control means of said current mirror circuit means;
  first inverting amplifier having an input terminal and an output terminal, said input terminal being coupled to said second electrode of said fourth electron control means, said output terminal being connected to the first output terminal of the audio bridge circuit; and
  second inverting amplifier having an input terminal and an output terminal, said input terminal being connected to said second electrode of said fifth electron control means, said output terminal being connected to second output terminal of the audio bridge circuit.

18. The audio bridge circuit of claim 17 wherein said amplifier means includes:
  first resistive means connected between the first output of the audio bridge circuit and said first electrode of said first electron control means of said amplifier means;
  second resistive means connected between the second output of the audio bridge circuit and said first electrode of said second electron control means of said amplifier means; and
  third resistive means coupled between said first electrode of said first electron control means of said amplifier means and said first electrode of said second electron control means of said amplifier means.

* * * * *